US012708044B2

(12) United States Patent
Bang et al.

(10) Patent No.: US 12,708,044 B2
(45) Date of Patent: Aug. 11, 2026

(54) MEMORY STACK STRUCTURE INCLUDING POWER DISTRIBUTION STRUCTURES AND A HIGH-BANDWIDTH MEMORY INCLUDING THE MEMORY STACK STRUCTURE

(71) Applicant: SK hynix Inc., Icheon-si (KR)

(72) Inventors: Je Min Bang, Icheon-si (KR); Bum Su Kim, Icheon-si (KR); Jin Ho Kim, Icheon-si (KR); Jea Hoon Park, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 566 days.

(21) Appl. No.: 18/320,455

(22) Filed: May 19, 2023

(65) Prior Publication Data

US 2024/0213219 A1 Jun. 27, 2024

(30) Foreign Application Priority Data

Dec. 21, 2022 (KR) ........................ 10-2022-0180425

(51) Int. Cl.

| | |
|---|---|
| ***H10B 80/00*** | (2026.01) |
| ***H10W 70/63*** | (2026.01) |
| ***H10W 70/65*** | (2026.01) |
| ***H10W 90/00*** | (2026.01) |
| *H10W 90/20* | (2026.01) |

(52) U.S. Cl.

CPC ............ *H10W 90/00* (2026.01); *H10B 80/00* (2023.02); *H10W 70/635* (2026.01); *H10W 70/65* (2026.01); *H10W 90/297* (2026.01); *H10W 90/722* (2026.01); *H10W 90/792* (2026.01)

(58) Field of Classification Search

CPC ........... H01L 25/0657; H01L 23/49827; H01L 23/49838; H01L 24/08; H10B 80/00; H10W 70/635; H10W 70/65

See application file for complete search history.

(56) References Cited

U.S. PATENT DOCUMENTS

| | | | | |
|---|---|---|---|---|
| 9,331,062 | B1 * | 5/2016 | Lane | H01L 23/5223 |
| 10,096,577 | B2 * | 10/2018 | Kim | G11C 5/025 |
| 2020/0303361 | A1 * | 9/2020 | Shih | H01L 23/481 |
| 2022/0020690 | A1 | 1/2022 | Kim et al. | |
| 2022/0059418 | A1 * | 2/2022 | Makabe | G01R 31/2632 |

FOREIGN PATENT DOCUMENTS

| | | | |
|---|---|---|---|
| KR | 10-2020-0065762 | A | 6/2020 |
| KR | 10-2021-0075662 | A | 6/2021 |

* cited by examiner

*Primary Examiner* — Dale E Page
*Assistant Examiner* — Wilner Jean Baptiste

(57) ABSTRACT

A memory stack structure incudes a base die; a bottom memory die stacked over the base die; an intermediate memory die stacked over the bottom memory die; a top memory die stacked over the intermediate memory die; a signal transmission structure electrically connecting the base die, the bottom memory die, the intermediate memory die, and the top memory die to each other; a first power distribution structure electrically connecting the base die to the bottom memory die; and a second power distribution structure electrically connecting the bottom memory die, the intermediate memory die, and the top memory die to each other.

20 Claims, 15 Drawing Sheets

MEMORY STACK STRUCTURE INCLUDING POWER DISTRIBUTION STRUCTURES AND A HIGH-BANDWIDTH MEMORY INCLUDING THE MEMORY STACK STRUCTURE

CROSS-REFERENCE TO RELATED APPLICATIONS

The present application claims priority under 35 U.S.C. § 119 to Korean Patent Application No. 10-2022-0180425, filed on Dec. 21, 2022, in the Korean Intellectual Property Office, which is incorporated herein by reference in its entirety.

BACKGROUND

1. Field

The present disclosure relates to a memory stack structure and a high-bandwidth memory with the memory stack structure, which includes power distribution structures.

2. Description of the Related Art

As the number of stacked memory devices in memory stack structures increases, power supplied to the stacked memory devices from various sources can become unstable.

SUMMARY

An embodiment of the present disclosure provides a memory stack structure incudes a base die; a bottom memory die stacked over the base die; an intermediate memory die stacked over the bottom memory die; a top memory die stacked over the intermediate memory die; a signal transmission structure electrically connecting the base die, the bottom memory die, the intermediate memory die, and the top memory die to each other; a first power distribution structure electrically connecting the base die to the bottom memory die; and a second power distribution structure electrically connecting the bottom memory die, the intermediate memory die, and the top memory die to each other.

An embodiment of the present disclosure provides a memory stack structure includes a base die; a bottom memory die stacked over the base die; an intermediate memory die stacked over the bottom memory die; a top memory die stacked over the intermediate memory die; a first power distribution structure directly connecting the base die to the bottom memory die, wherein the first power distribution structure is not directly connected to the intermediate memory die and the top memory die; a second power distribution structure electrically connecting the bottom memory die, the intermediate memory die, and the top memory die to each other, wherein the second power distribution structure is not directly connected to the base die; and a third power distribution structure electrically connecting the base die, the bottom memory die, the intermediate memory die, and the top memory die to each other. The bottom memory die includes a first power connection wiring electrically connecting the first power distribution structure to the second power distribution structure.

An embodiment of the present disclosure provides a high-bandwidth memory includes a memory stack structure mounted over an interposer. The memory stack structure includes a base die; a bottom memory die stacked over the base die; an intermediate memory die stacked over the bottom memory die; a top memory die stacked over the intermediate memory die; a signal transmission structure electrically connecting the base die, the bottom memory die, the intermediate memory die, and the top memory die to each other; a first power distribution structure electrically connecting the base die to the bottom memory die; and a second power distribution structure electrically connecting the bottom memory die, the intermediate memory die, and the top memory die to each other.

BRIEF DESCRIPTION OF THE DRAWINGS

FIGS. 10A and 10B are layouts illustrating block arrangement of a base die and memory dies according to an embodiment of the present disclosure.

FIG. 11A is a side view schematically illustrating a memory stack structure according to an embodiment of the present disclosure.

FIGS. 12A and 12B are views schematically illustrating high-bandwidth memories according to embodiments of the present disclosure.

DETAILED DESCRIPTION

Embodiments of the present disclosure provide a memory stack structure and a high-bandwidth memory having power distribution structures.

Embodiments of the present disclosure provide power distribution structures disposed in an area where a through via structure cannot be formed.

Figure 1:
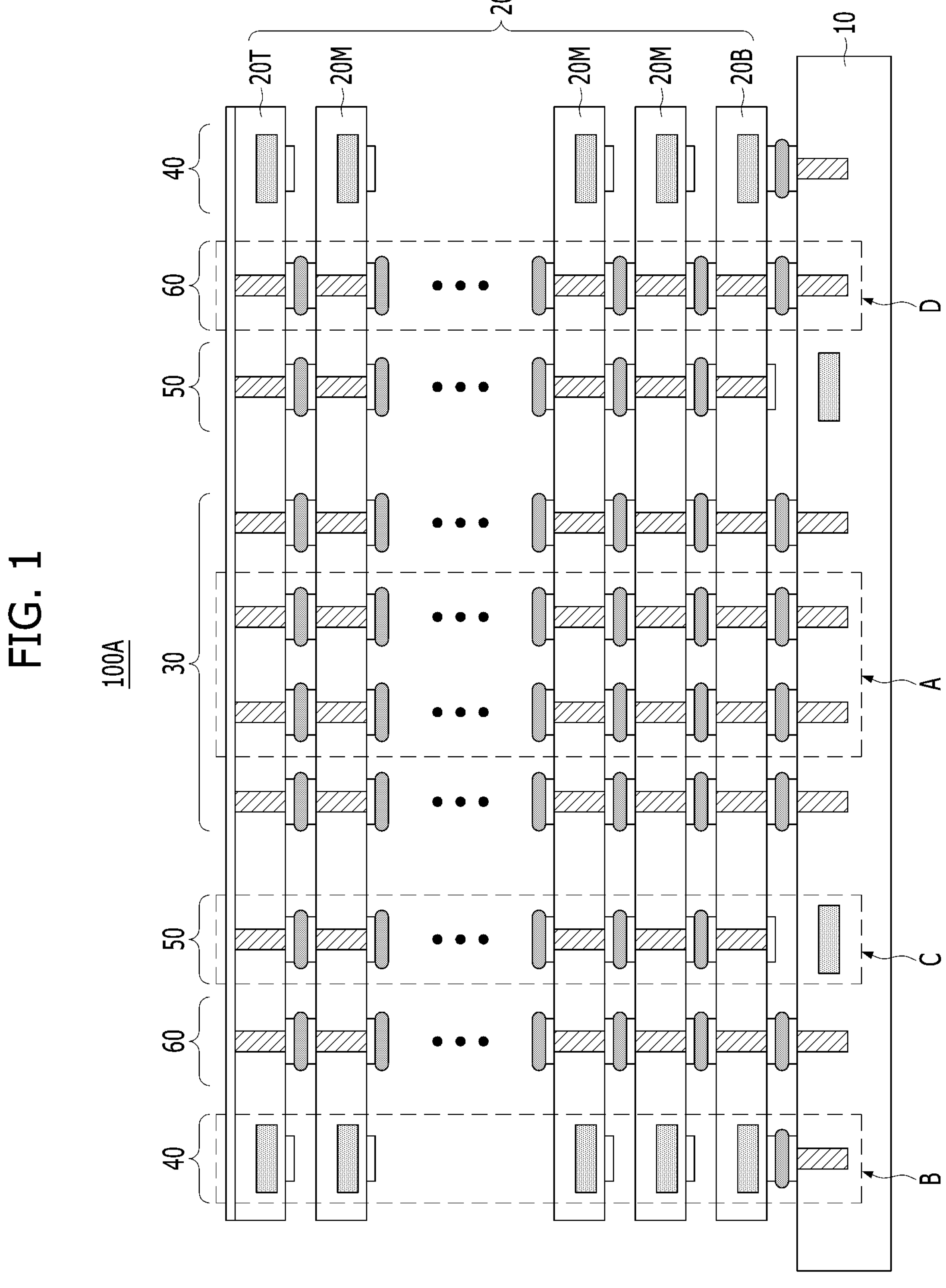
FIG. 1 is a side view schematically illustrating a memory stack structure according to an embodiment of the present disclosure.

FIG. 1 is a side view schematically illustrating a memory stack structure according to an embodiment of the present disclosure. Referring to FIG. 1, a memory stack structure 100A may include a base die 10, a memory stack 20, signal transmission structures 30, and power distribution structures 40, 50, and 60. The memory stack 20 may be mounted and stacked on the base die 10.

The base die 10 may include a plurality of electrical circuits disposed on a semiconductor substrate such as a silicon wafer. For example, the base die 10 may include a PHY circuit for electrically connecting to an external system, a test circuit for testing the memory stack 20, and an interface circuit for signal transmission and power distribution.

The memory stack 20 may include a plurality of stacked memory dies 20B, 20M and 20T. The plurality of memory dies 20B, 20M and 20T may include a bottom memory die 20B, a plurality of intermediate memory dies 20M, and a top memory die 20T. The bottom memory die 20B may be located at the lowest portion of the memory stack 10 and may be directly stacked on the base die 10. The top memory die 20T may be stacked on the uppermost portion of the memory stack 20. The plurality of intermediate memory dies 20M may be stacked and disposed between the bottom memory die 20B and the top memory die 20T. The bottom memory die 20B, the intermediate memory dies 20M, and the top memory die 20T may be memory devices of the same kind that perform the same function. For example, each of the bottom memory die 20B, the intermediate memory dies 20M, and the top memory die 20T may include a dynamic random access memory (DRAM).

The base die 10 and the memory dies 20B, 20M, and 20T of the memory stack 20 may be electrically connected to each other through the signal transmission structures 30 and the power distribution structures 40, 50, and 60. The signal transmission structures 30 may electrically connect the base die 10, the bottom memory die 20B, the intermediate memory dies 20M and the top memory die 20T to each other. The power distribution structures 40, 50 and 60 may include a first power distribution structure 40, a second power distribution structure 50, and a third power distribution structure 60. The first power distribution structure 40 may directly and electrically connect the base die 10 to the bottom memory die 20B. The first power distribution structure 40 might not connect the base die 10 to the intermediate memory dies 20M and the top memory die 20T. The second power distribution structure 50 may vertically and electrically connect the bottom memory die 20B, the intermediate memory dies 20M, and the top memory die 20T to each other. The second power distribution structure 50 might not connect the base die 10 to the bottom memory die 20B, the intermediate memory dies 20M, and the top memory die 20T. The third power distribution structure 60 may vertically and electrically connect the base die 10, the bottom memory die 20B, the intermediate memory dies 20M, and the top memory die 20T, to each other. In the bottom memory die 20B, the first power distribution structure 40 and the second power distribution structure 50 may be electrically connected to each other.

Figure 2:
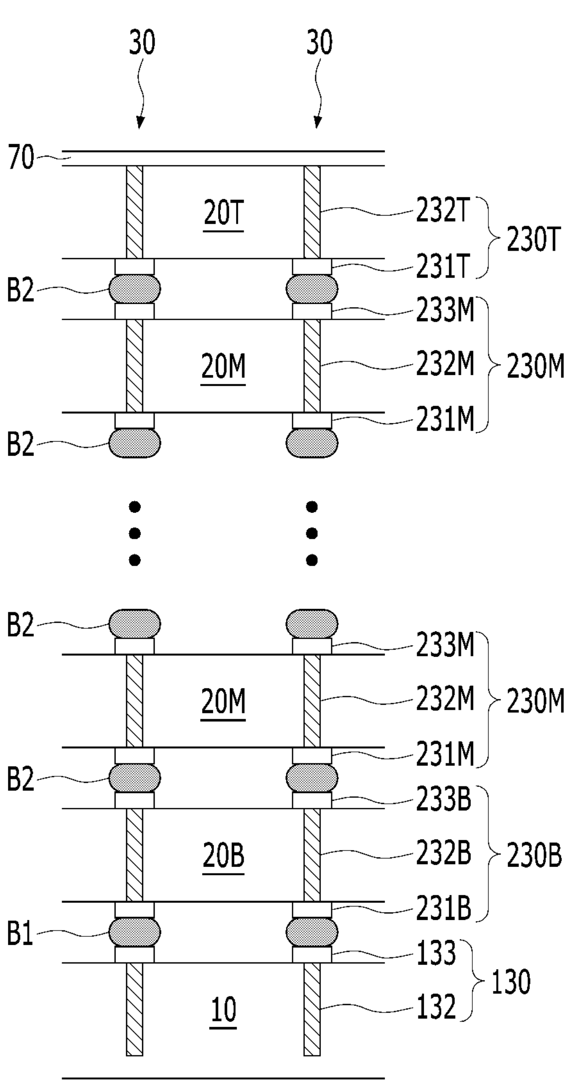
FIG. 2 is an enlarged view of an area A of FIG. 1 describing a signal transmission structure according to an embodiment of the present disclosure.

FIG. 2 is an enlarged view of an area A of FIG. 1 describing a signal transmission structure according to an embodiment of the present disclosure. Referring to FIGS. 1 and 2, a signal transmission structure 30 may electrically connect the base die 10, the bottom memory die 20B, the intermediate memory dies 20M, and the top memory die 20T to each other. The signal transmission structure 30 may include a base signal transmission structure 130, a bottom signal transmission structure 230B, intermediate signal transmission structures 230M, and a top signal transmission structure 230T electrically connected to each other. The signal transmission structure 30 may further include a base connector B1 between the base die 10 and the bottom memory die 20B and inter-die connectors B2 between the memory dies 20B, 20M, and 20T. The base connector B1 may be disposed between the base signal transmission structure 130 and the bottom signal transmission structure 230B to electrically connect the base signal transmission structure 130 and the bottom signal transmission structure 230B to each other. The inter-die connectors B2 may be disposed between the bottom signal transmission structure 230B, the intermediate signal transmission structures 230M, and the top signal transmission structures 230T to electrically connect the bottom signal transmission structures 230B, the intermediate signal transmission structures 230M, and the top signal transmission structures 230T to each other.

The base signal transmission structure 130 may include a base signal via structure 132 and a base signal bump 133. The base signal via structure 132 may vertically extend inside the base die 10. The base signal via structure 132 may vertically partially pass through the base die 10. The base signal via structure 132 may be electrically connected to electrical circuits in the base die 10. The base signal bump 133 may be disposed on an upper surface of the base die 10. The base signal bump 133 may be disposed on the base signal via structure 132 to be vertically aligned with the base signal via structure 132, and the base signal bump 133 may be physically and electrically connected to the base connector B1.

The bottom signal transmission structure 230B may include a bottom lower signal bump 231B, a bottom signal via structure 232B, and a bottom upper signal bump 233B. The bottom lower signal bump 231B may be disposed on a lower surface of the bottom memory die 20B. The bottom lower signal bump 231B may electrically connect the base connector B1 to the bottom signal via structure 232B. The bottom signal via structure 232B may extend to vertically pass through the bottom memory die 20B. The bottom signal via structure 232B may electrically connect the bottom lower signal bump 231B to the bottom upper signal bump 233B. The bottom upper signal bump 233B may be disposed on an upper surface of the bottom memory die 20B. The bottom upper signal bump 233B may electrically connect the bottom signal via structure 232B to the inter-die connector B2.

The intermediate signal transmission structures 230M may include intermediate lower signal bumps 231M, intermediate signal via structures 232M, and intermediate upper signal bumps 233M, respectively. The intermediate lower signal bumps 231M may be disposed on lower surfaces of the intermediate memory dies 20M, respectively. The intermediate lower signal bumps 231M may electrically connect the lower inter-die connectors B2 and the intermediate signal via structures 232M. The intermediate signal via structures 232M may extend to vertically pass through the intermediate memory dies 20M, respectively. The intermediate signal via structures 232M may electrically connect the intermediate lower signal bumps 231M to the intermediate upper signal bumps 233M. The intermediate upper signal bumps 233M may be disposed on upper surfaces of the intermediate memory dies 20M, respectively. The intermediate upper signal bumps 233M may electrically connect the intermediate signal via structures 232M to the inter-die connectors B2 immediately above the intermediate memory dies 20M, respectively.

The top signal transmission structure 230T may include a top lower signal bump 231T and a top signal via structure 232T. The top lower signal bump 231T may be disposed on a lower surface of the top memory die 20T. The top lower signal bump 231T may electrically connect the inter-die connector B2 immediately below top signal transmission structure 230T to the top signal via structure 232T. The top signal via structure 232T may extend to vertically pass through the top memory die 20T. A top end of the top signal via structure 232T and an upper surface of the top memory die 20T may be covered with a top capping insulating layer 70. The top capping insulating layer 70 may include an inorganic insulating layer such as silicon nitride or a polymer organic layer such as polyimide isoindro quindzoline (PIQ).

The base signal bump via structure 132, the bottom signal via structure 232B, the intermediate signal via structures 232M, and the top signal via structure 232T may include copper (Cu). In an embodiment, the base signal bump 133, the bottom lower signal bump 231B, the bottom upper signal bump 233B, the intermediate lower signal bumps 231M, the intermediate upper signal bumps 233M, and the top lower signal bump 231T may include at least two of a copper layer, a nickel layer, a tin layer, a silver layer, a gold layer, a titanium layer, and a titanium nitride layer.

The signal transmission structure 30 may transmit at least one of a chip selection signal, a command signal, an address signal, a clock signal, a strobe signal, or a data signal. In another embodiment, the signal transmission structure 30 may transmit some of various external voltages such as VDD, VDDQ, VSS, VSSQ, VPP, or ground from the base die 10 to the memory dies 20B, 20M, and 20T.

Figure 3:
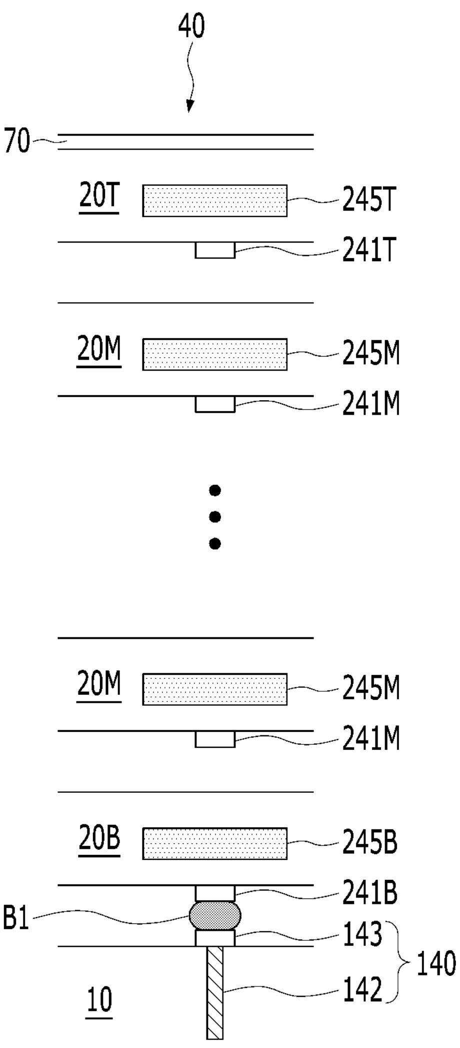
FIG. 3 is an enlarged view of an area B of FIG. 1 describing a first power distribution structure according to an embodiment of the present disclosure.

FIG. 3 is an enlarged view of an area B of FIG. 1 describing a first power distribution structure according to an embodiment of the present disclosure. Referring to FIGS. 1 and 3, a first power distribution structure 40 may electrically and vertically connect the base die 10 to the bottom memory die 20B. The first power distribution structure 40 may include a base first power distribution structure 140 and a bottom lower first power bump 241B electrically connected to each other. The base first power distribution structure 140 may include a base first power via structure 142 and a base first power bump 143.

Each of the memory dies 20B, 20M, and 20T may include memory circuits 245B, 245M, and 245T, respectively. For example, the bottom memory die 20B may include a bottom memory circuit 245B, each of the intermediate memory dies 20M may include intermediate memory circuits 245M, and the top memory die 20T may include a top memory circuit 245T. The memory circuits 245B, 245M, and 245T may include one of memory cell circuits or peripheral circuits. Each of the memory circuits 245B, 245M, and 245T may be disposed at a position vertically aligned and overlapped with the base first power distribution structure 140. Accordingly, due to the memory circuits 245B, 245M, and 245T, a via structure vertically aligned and overlapped with the base first power distribution structure 140 might not be formed in the first power distribution structure 40.

The first power distribution structure 40 may not include bottom memory dies 20B, intermediate memory dies 20M, and top memory dies 20T that are directly connected to each other. For example, power bumps on upper surfaces of the memory dies might not be selectively formed in areas vertically aligned with the base first power distribution structure 140 and the memory circuits 245B, 245M, and 245T.

The memory dies 20M and 20T may include lower dummy bumps 241M and 241T disposed at positions vertically aligned with the base first power distribution structure 140. The intermediate memory dies 20M may include intermediate lower dummy bumps 241M, respectively. The top memory die 20T may include a top lower dummy bump 241T. The intermediate lower dummy bumps 241M may be formed on the lower surfaces of the intermediate memory dies 20M, and the top lower dummy bumps 241T may be formed on the lower surface of the top memory die 20T.

In an embodiment, the intermediate lower dummy bumps 241M and the top lower dummy bumps 241T may be dummy elements. In another embodiment, the inter-die connectors B2 might not be formed at positions vertically aligned with the base first power distribution structure 140. That is, the intermediate lower dummy bumps 241M and the top lower dummy bumps 241T might not be connected directly to the inter-die connectors B2. In an embodiment, upper bumps may not be formed in an area vertically aligned with the base first power distribution structure 140 of the upper surfaces of the memory dies 20B, 20M, and 20T.

The first power distribution structure 40 may directly transmit some of various external voltages such as VDD, VDDQ, VSS, VSSQ, VPP, or ground from the base die 10 to the bottom memory die 20B.

The base first power via structure 142 may include copper (Cu). The base first power bump 143 and the bottom lower first power bump 241B, the intermediate lower dummy bumps 241M, and the top lower dummy bump 241T may include at least two of a copper layer, a nickel layer, a tin layer, a silver layer, a gold layer, a titanium layer, and a titanium nitride layer.

Figure 4:
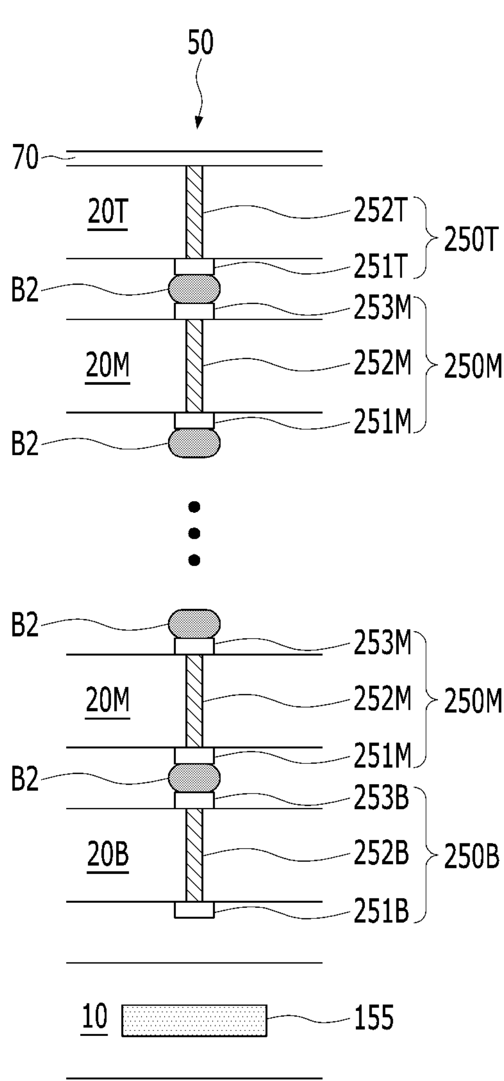
FIG. 4 is an enlarged view of an area C of FIG. 1 describing a second power distribution structure according to an embodiment of the present disclosure.

FIG. 4 is an enlarged view of an area C of FIG. 1 describing a second power distribution structure according to an embodiment of the present disclosure. Referring to FIGS. 1 and 4, a second power distribution structure 50 may electrically and vertically connect the bottom memory die 20B, the intermediate memory dies 20M, and the top memory dies 20T to each other. The second power distribution structure 50 may include a bottom second power distribution structure 250B, intermediate second power distribution structures 250M, and a top second power distribution structure 250T.

The bottom second power distribution structure 250B may include a bottom lower second power bump 251B, a bottom second power via structure 252B, and a bottom upper second power bump 253B. The bottom lower second power bump 251B may be disposed on the lower surface of the bottom memory die 20B. The bottom lower second power bump 251B may be electrically connected to the bottom second power via structure 252B. The bottom second power via structure 252B may extend to vertically pass through the bottom memory die 20B. The bottom second power via structure 252B may electrically connect the bottom lower second power bump 251B to the bottom upper second power bump 253B. The bottom upper second power bump 253B may be disposed on the upper surface of the bottom memory die 20B. The bottom upper second power bump 253B may electrically connect the bottom second power via structure 252B to the inter-die connector B2.

The intermediate second power distribution structures 250M may each respectively include intermediate lower second power bumps 251M, intermediate second power via structures 252M, and intermediate upper second power bumps 253M. The intermediate lower second power bumps 251M may be disposed on the lower surfaces of the intermediate memory dies 20M, respectively. The intermediate lower second power bumps 251M may electrically connect the lower inter-die connectors B2 to the intermediate second power via structures 252M, respectively. The intermediate second power via structures 252M may extend to vertically pass through the intermediate memory dies 20M, respectively. The intermediate second power via structures 252M may electrically connect the intermediate lower second power bumps 251M to the intermediate upper second power bumps 253M, respectively. The intermediate upper second power bumps 253M may be disposed on the upper surfaces of the intermediate memory dies 20M, respectively. The intermediate upper second power bumps 253M may electrically connect the intermediate second power via structures 252M to the upper inter-die connectors B2, respectively.

The top second power distribution structure 250T may include a top lower second power bump 251T and a top second power via structure 252T. The top lower second power bump 251T may be disposed on the lower surface of the top memory die 20T. The top lower second power bump 251T may electrically connect the lower inter-die connector B2 to the top second power via structure 252T. The top second power via structure 252T may extend to vertically pass through the top memory die 20T. A top end of the top second power via structure 252T and the upper surface of the top memory die 20T may be covered with a top capping insulating layer 70.

The base die 10 may further include a base circuit 155 disposed in an area vertically aligned and overlapped with the second power distribution structure 50. Due to the base circuit 155, a via structure might not be formed in the area of the base die 10 vertically aligned with the second power distribution structure 50.

The bottom second power via structure 252B, the intermediate second power via structures 252M, and the top second power via structure 252T may include copper (Cu). In an embodiment, the bottom second power signal bump 251B, the bottom upper second power bump 253B, the intermediate lower second power bumps 251M, the intermediate upper second power bumps 253M, and the top lower second power bump 251T may include at least two of a copper layer, a nickel layer, a tin layer, a silver layer, a gold layer, a titanium layer, and a titanium nitride layer.

Figure 5:
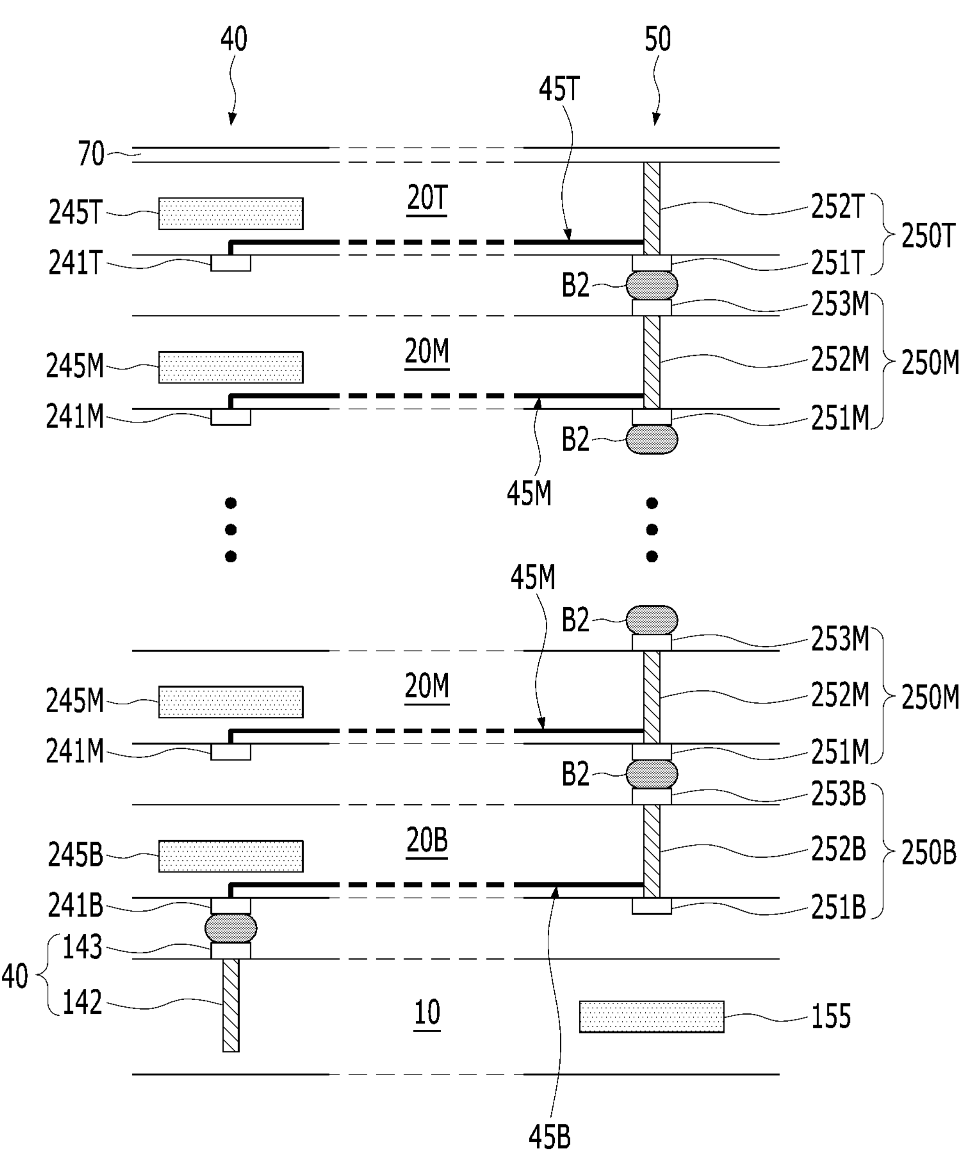
FIG. 5 is a view illustrating an electrical connection between a first power distribution structure and a second power distribution structure according to an embodiment of the present disclosure.

FIG. 5 is a view illustrating an electrical connection between a first power distribution structure and a second power distribution structure according to an embodiment of the present disclosure. Referring to FIG. 5, a first power distribution structure 40 and a second power distribution structure 50 may be electrically connected to each other in the bottom memory die 20B. For example, the bottom lower first power bump 241B of the first power distribution structure 40 and the bottom lower second power bump 251B of the second power distribution structure 50 may be electrically connected to each other through a first bottom power connection wiring 45B and the bottom second power via structure 252B. Although the first bottom power connection wiring 45B electrically connects the bottom lower first power bump 241B to the bottom second power via structure 252B, the first bottom power connection wiring 45B may electrically and directly connect the bottom lower first power bump 241B to the bottom lower second power bump 251B. In another embodiment, the bottom lower first power bump 241B and the first bottom power connection wiring 45B may be electrically connected to each other through other conductive elements. In another embodiment, the first bottom power connection wiring 45B may be connected to the bottom second power via structure 252B or the bottom lower second power bump 251B through other conductive elements. Power transmitted from the base die 10 to the bottom memory die 20B through the first power distribution structure 40 may be transmitted to the intermediate memory dies 20M and the top memory die 20T through the first bottom power connection wiring 45B and elements of the second power distribution structure 50.

The intermediate memory dies 20M may further include first intermediate power connection wirings 45M electrically connecting the intermediate lower dummy bumps 241M to the intermediate lower second power bumps 251M, respectively. For example, the intermediate lower dummy bump 241M of the first power distribution structure 40 and the intermediate lower second power bumps 251M of the second power distribution structure 50 may be electrically connected to each other through the first intermediate power connection wiring 45M (and the intermediate second power via structure 252M). Although the first intermediate power connection wirings 45M electrically connect the intermediate lower dummy bumps 241M to the intermediate second power via structures 252M, respectively, the first intermediate power connection wirings 45M may electrically and directly connect the intermediate lower dummy bumps 241M to the intermediate lower second power bumps 251M, respectively. In another embodiment, the intermediate lower dummy bumps 241M and the first intermediate power connection wirings 45M may be connected each other through other conductive elements, respectively. In another embodiment, the first intermediate power connection wirings 45M may be connected to the intermediate second power via structures 252M or the intermediate lower second power bump 251M through other conductive elements, respectively.

The top memory die 20T may further include a first top power connection wiring 45T electrically connecting the top lower dummy bump 241T to the top lower second power bump 251T. For example, the top lower dummy bump 241T, a dummy element, of the first power distribution structure 40 and the top lower second power bump 251T of the second power distribution structure 50 may be electrically connected to each other through the first top power connection wiring 45T and the top second power via structure 252T.

Although the first top power connection wiring 45T electrically connects the top lower dummy bump 241T to the top second power via structure 252B, the first top power connection wiring 45B may electrically and directly connect the top lower dummy bump 241T to the top lower second power bump 251T. In another embodiment, the top lower dummy bump 241T and the first top power connection wiring 45T may be electrically connected to each other through other conductive elements. In another embodiment, the first top power connection wiring 45T may be connected to the top second power via structure 252T or the top lower second power bump 251T through other conductive elements.

According to the technical concepts of embodiments of the disclosure, power provided to the bottom memory die 20B through the base first power distribution structure 140, formed in the area where the base circuit 155 is not formed, can be distributed to the memory dies 20M, 20M, 20T through the bottom second power via structures 252B and the intermediate second power via structures 252M.

Figure 6:
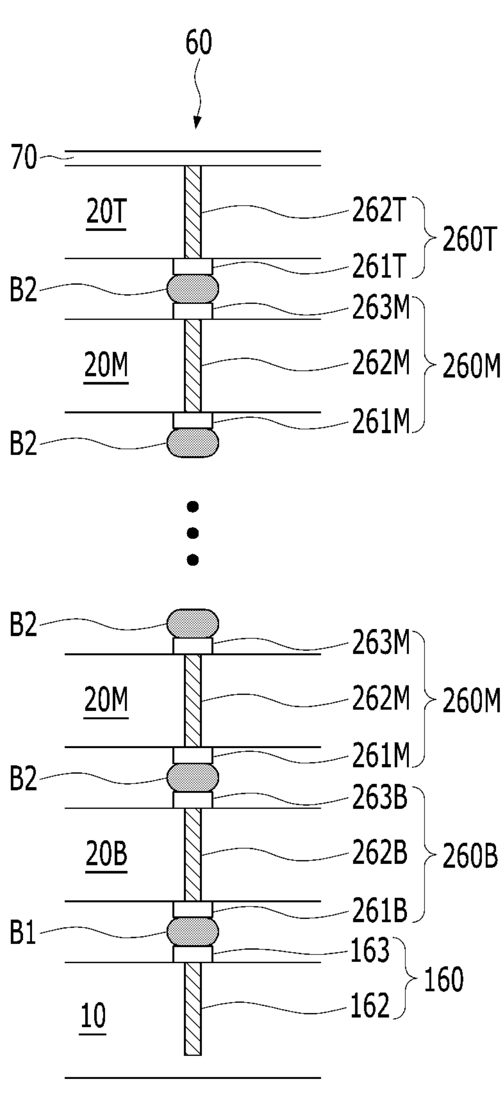
FIG. 6 is an enlarged view of an area D of FIG. 1 describing a third power distribution structure according to an embodiment of the present disclosure.

FIG. 6 is an enlarged view of an area D of FIG. 1 describing a third power distribution structure according to an embodiment of the present disclosure. Referring to FIGS. 1 and 6, a third power distribution structure 60 may electrically connect the base die 10, the bottom memory die 20B, the intermediate memory dies 20M, and the top memory die 20T to each other. The third power distribution structure 60 may include a base third power distribution structure 160, a bottom third power distribution structure 260B, intermediate third power distribution structures 260M, and a top third power distribution structure 260T electrically connected to each other. The third power distribution structure 60 may further include a base connector B1 between the base die 10 and the bottom memory die 20B and inter-die connectors B2 between the memory dies 20B, 20M, and 20T. That is, the base connector B1 may be disposed between the base third power distribution structure 160 and the bottom third power distribution structure 260B to electrically connect the base third power distribution structure 160 to the bottom third power distribution structure 260B. The inter-die connectors B2 may be disposed between the bottom third power distribution structure 260B, the intermediate third power distribution structures 260M, and the top third power distribution structures 260T to electrically connect the bottom third power distribution structures 260B, the intermediate third power distribution structures 260M, and the top third power distribution structures 260T.

The base third power distribution structure 160 may include a base third power via structure 162 and a base third power bump 163. The base third power via structure 162 may extend vertically inside the base die 10. The base third power via structure 162 may vertically partially pass through the base die 10. The base third power via structure 162 may be electrically connected to electrical circuits in the base die 10. The base third power bump 163 may be disposed on the upper surface of the base die 10. The base third power bump 163 may be disposed on the base third power via structure 162 to be vertically aligned with each other. The base third bump 163 may be physically and electrically connected to the base connector B1.

The bottom third power distribution structure 260B may include a bottom lower third power bump 261B, a bottom third power via structure 262B, and a bottom upper third power bump 263B. The bottom lower third power bump 261B may be disposed on the lower surface of the bottom memory die 20B. The bottom lower third power bump 261B may electrically connect the base connector B1 to the bottom third power via structure 262B. The bottom third power via structure 262B may extend to vertically pass through the bottom memory die 20B. The bottom third power via structure 262B may electrically connect the bottom lower third power bump 261B to the bottom upper third power bump 263B. The bottom upper third power bump 263B may be disposed on the upper surface of the bottom memory die 20B. The bottom upper third power bump 263B may electrically connect the bottom third power via structure 262B to the inter-die connector B2.

The intermediate third power distribution structures 260M may each respectively include intermediate lower third power bumps 261M, intermediate third power via structures 262M, and intermediate upper third power bumps 263M. The intermediate lower third power bumps 261M may be disposed on the lower surfaces of the intermediate memory dies 20M. The intermediate lower third power bumps 261M may electrically connect the lower inter-die connectors B2 to the intermediate third power via structures 262M, respectively. The intermediate third power via structures 262M may extend to vertically pass through the intermediate memory dies 20M. The intermediate third power via structures 262M may electrically connect the intermediate lower third power bumps 261M to the intermediate upper third power bumps 263M, respectively. The intermediate upper third power bumps 263M may be disposed on the upper surfaces of the intermediate memory dies 20M. The intermediate upper third power bumps 263M may electrically connect the intermediate third power via structures 262M to the upper inter-die connectors B2, respectively.

The top third power distribution structure 260T may include a top lower third power bump 261T and a top third power via structure 262T. The top lower third power bump 261T may be disposed on the lower surface of the top memory die 20T. The top lower third power bump 261T may electrically connect the lower inter-die connector B2 to the top third power via structure 262T. The top third power via structure 262T may extend to vertically pass through the top memory die 20T. A top end of the top third power via structure 262T and the upper surface of the top memory die 20T may be covered with the top capping insulating layer 70.

The base third power bump via structure 162, the bottom third power via structure 262B, the intermediate third power via structures 262M, and the top third power via structure 262T may include copper (Cu). In an embodiment, the base third power bump 163, the bottom lower third power bump 261B, the bottom upper third power bump 263B, the intermediate lower third power bumps 261M, the intermediate upper third power bumps 263M, and the top lower third power bump 261T may include at least two of a copper layer, a nickel layer, a tin layer, a silver layer, a gold layer, and a titanium layer.

The third power distribution structure 60 may directly transmit some of various external voltages such as VDD, VDDQ, VSS, VSSQ, VPP, or ground voltage from the base die 10 to the memory dies 20B, 20M, and 20T.

Figure 7:
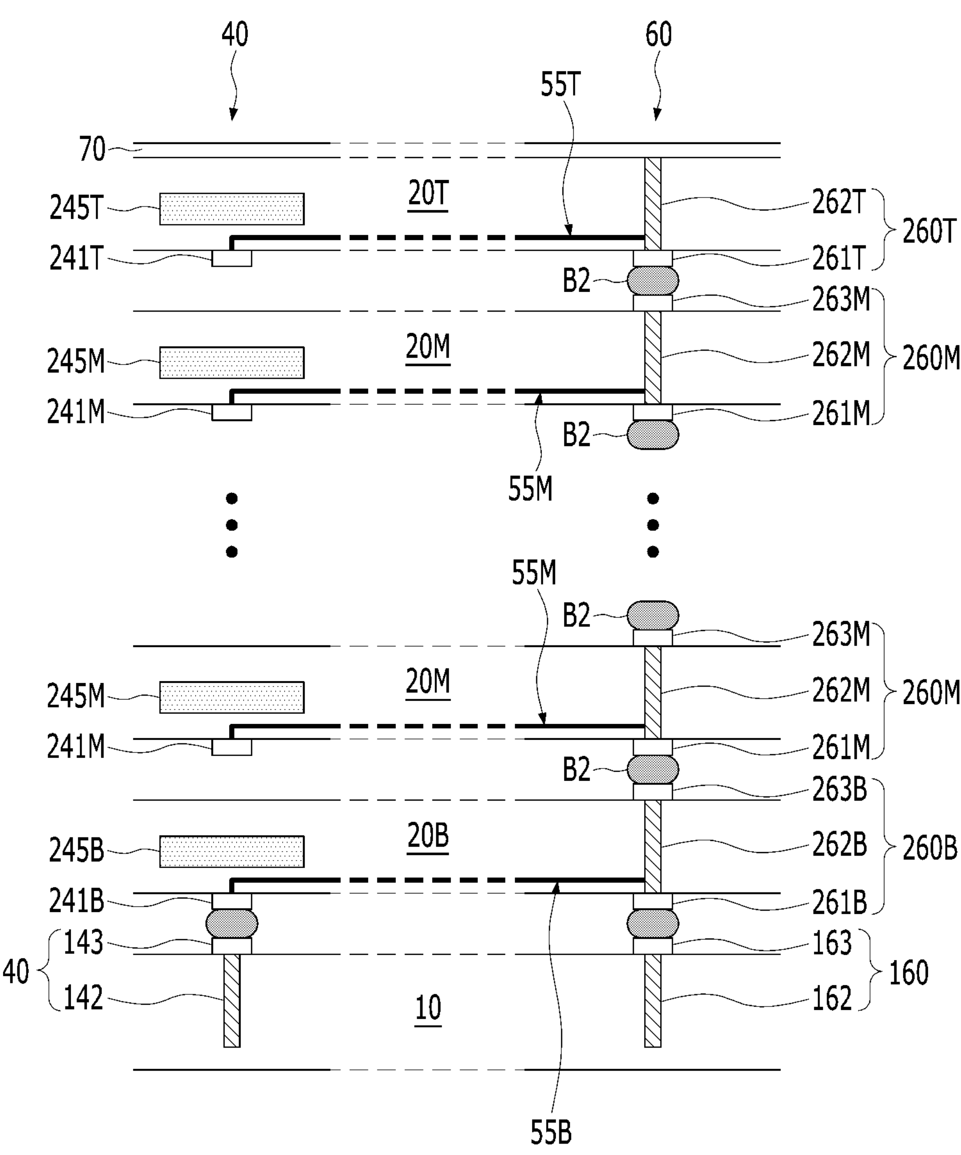
FIG. 7 is a view illustrating an electrical connection between a first power distribution structure and a third power distribution structure according to an embodiment of the present disclosure.

FIG. 7 is a view illustrating an electrical connection between a first power distribution structure and a third power distribution structure. Referring to FIG. 7, a first power distribution structure 40 and a third power distribution structure 60 may be electrically connected to each other in the bottom memory die 20B. For example, the bottom lower first power bump 241B of the first power distribution structure 40 and the bottom lower third power bump 261B of the third power distribution structure 60 may be electrically connected to each other through the second bottom power connection wiring 55B and the bottom third power via structure 262B. Although the second bottom power connection wiring 55B electrically connects the bottom lower first power bump 241B to the bottom third power via structure 262B, the second bottom power connection wiring 55B may electrically and directly connect the bottom lower first power bump 241B to the bottom lower third power bump 261B. In another embodiment, the bottom lower first power bump 241B and the second bottom power connection wiring 55B may be electrically connected to each other through other conductive elements. In another embodiment, the second bottom power connection wiring 55B may be connected to the bottom third power via structure 262B or the bottom lower third power bump 261B through other conductive elements.

The intermediate memory dies 20M may further include second intermediate power connection wirings 55M electrically connecting the intermediate lower dummy bumps 241M to the intermediate lower third power bumps 261M, respectively. Although the second intermediate power connection wirings 55M electrically connect the intermediate lower dummy bumps 241M to the intermediate third power via structures 262M, respectively, the second intermediate power connection wirings 55M may electrically and directly connect the intermediate lower dummy bumps 241M to the intermediate lower third power bumps 261M, respectively. In another embodiment, the intermediate lower dummy bumps 241M and the second intermediate power connection wirings 55M may be connected each other through other conductive elements, respectively. In another embodiment, the second intermediate power connection wirings 55M may be connected to the intermediate third power via structures 262M or the intermediate lower third power bump 261M through other conductive elements, respectively.

The top memory die 20T may further include a second top power connection wiring 55T electrically connecting the top lower dummy bump 241T to the top lower third power bump 261T. Although the second top power connection wiring 55T electrically connects the top lower dummy bump 241T to the top third power via structure 262T, the second top power connection wiring 55B may electrically and directly connect the top lower dummy bump 241T to the top lower third power bump 261T. In another embodiment, the top lower dummy bump 241T and the second top power connection wiring 55T may be electrically connected to each other through other conductive elements. In another embodiment, the second top power connection wiring 55T may be connected to the top third power via structure 262T or the top lower third power bump 261T through other conductive elements.

Figure 8:
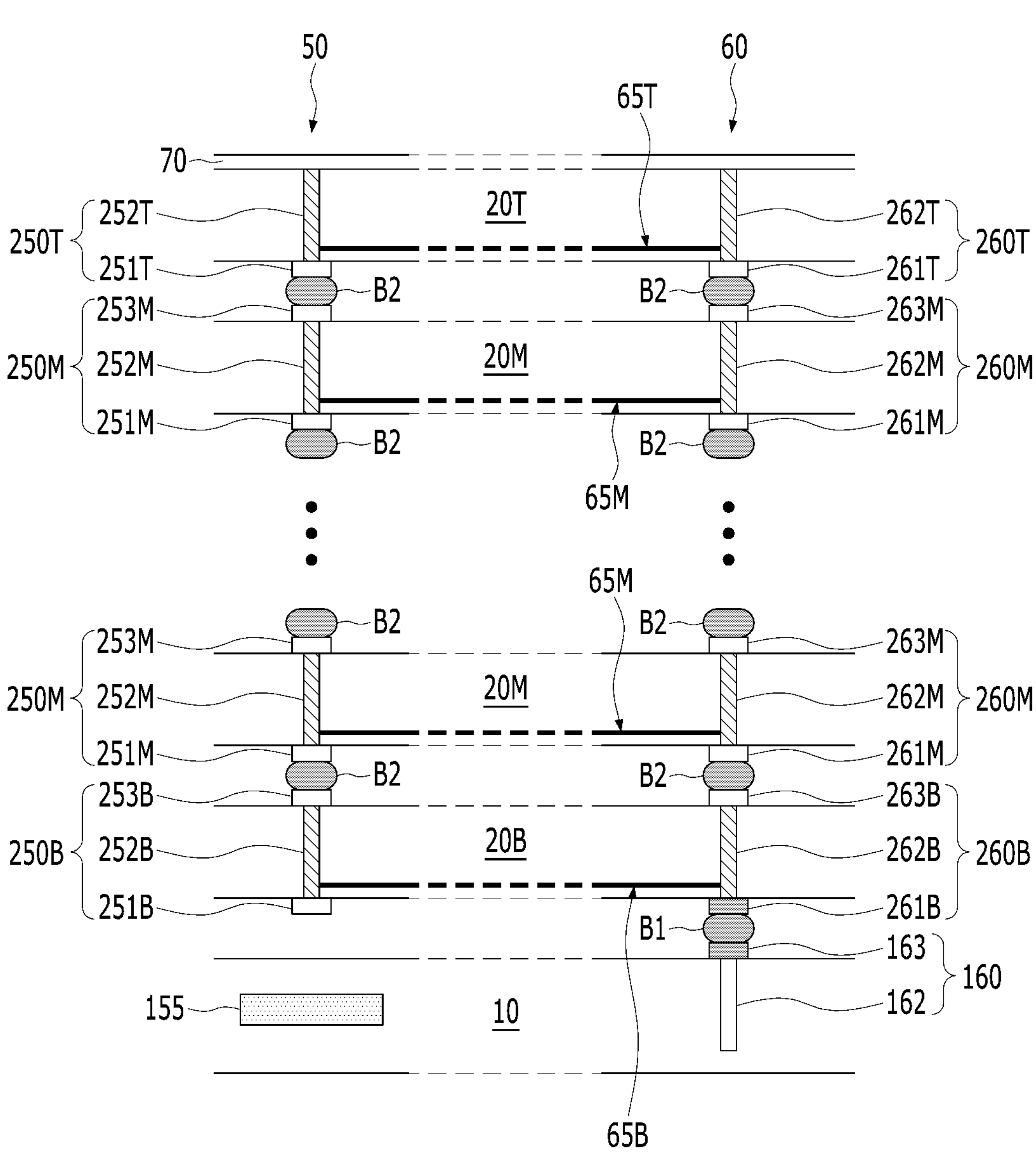
FIG. 8 is a view illustrating an electrical connection between a second power distribution structure and a third power distribution structure according to an embodiment of the present disclosure.

FIG. 8 is a view illustrating an electrical connection between a second power distribution structure and a third power distribution structure according to an embodiment of the present disclosure. Referring to FIG. 8, a second power distribution structure 50 and a third power distribution structure 60 may be electrically connected to each other in the bottom memory die 20B and the intermediate memory dies 20M, respectively.

For example, the bottom lower second power bump 251B, the bottom lower second power via structure 252B, and/or the bottom upper second power bump 253B of the second power distribution structure 50 may be electrically connected to the bottom lower third power bump 261B, the bottom third power via structure 262B, and/or the bottom upper third power bump 263B of the third power distribution structure 60 through a third bottom power connection wiring 65B. Although the third bottom power connection wiring 65B electrically connects the bottom lower second power via structure 252B to the bottom third power via structure 262B, the third bottom power connection wiring 65B may electrically and directly connect the bottom lower second power bump 251B to the bottom lower third power bump 261B. In another embodiment, the bottom lower second power bump 251B and the third bottom power connection wiring 65B may be electrically connected to each other through other conductive elements. In another embodiment, the third bottom power connection wiring 65B may be connected to the bottom third power via structure 262B or the bottom lower third power bump 261B through other conductive elements.

For example, the intermediate lower second power bumps 251M, the intermediate second power via structures 252M, and/or the intermediate upper second power bumps 253M of the second power distribution structure 50 may be electrically connected to the intermediate lower third power bumps 261M, the intermediate third power via structures 262M, and/or the intermediate upper third power bumps 263M through third intermediate power connection wirings 65M. Although the third intermediate power connection wirings 65M electrically connect the intermediate second power via structures 252M to the intermediate third power via structures 262M, respectively, the third intermediate power connection wirings 65M may electrically and directly connect the intermediate lower second bumps 251M to the intermediate lower third power bumps 261M, respectively. In another embodiment, the intermediate lower second power bumps 251M and the third intermediate power connection wirings 65M may be connected to each other through other conductive elements, respectively. In another embodiment, the third intermediate power connection wirings 65M may be connected to the intermediate third power via structures 262M or the intermediate lower third power bump 261M through other conductive elements, respectively.

For example, the top lower second power bump 251T and/or the top lower second power via structure 252T of the second power distribution structure 50 may be electrically connected to the top lower third power bump 261T and/or the top third power via structure 262T of the third power distribution structure 60 through a third top power connection wiring 65T. Although the third top power connection wiring 65T electrically connects the top lower second power via structure 252T to the top third power via structure 262T, the third top power connection wiring 65B may electrically and directly connect the top lower second power bump 251T to the top lower third power bump 261T. In another embodiment, the top lower second power bump 251T and the third top power connection wiring 65T may be electrically connected to each other through other conductive elements. In another embodiment, the third top power connection wiring 65T may be connected to the top third power via structure 262T or the top lower third power bump 261T through other conductive elements.

In an embodiment, the first to third bottom power connection wirings 45B, 55B, and 65B may be electrically connected with each other. In an embodiment, the first to third intermediate power connection wirings 45M, 55M, and 65M may be electrically connected with each other. In an embodiment, the first to third top power connection wirings 45T, 55T, and 65T may be electrically connected with each other.

That is, according to the technical concepts of the present disclosure, all elements of the first power distribution structure 40, the second power distribution structure 50, and the third power distribution structure 60 may be electrically connected to each other in the bottom memory die 20B, the intermediate memory dies 20M, and the top memory die 20T, respectively.

Figure 9:
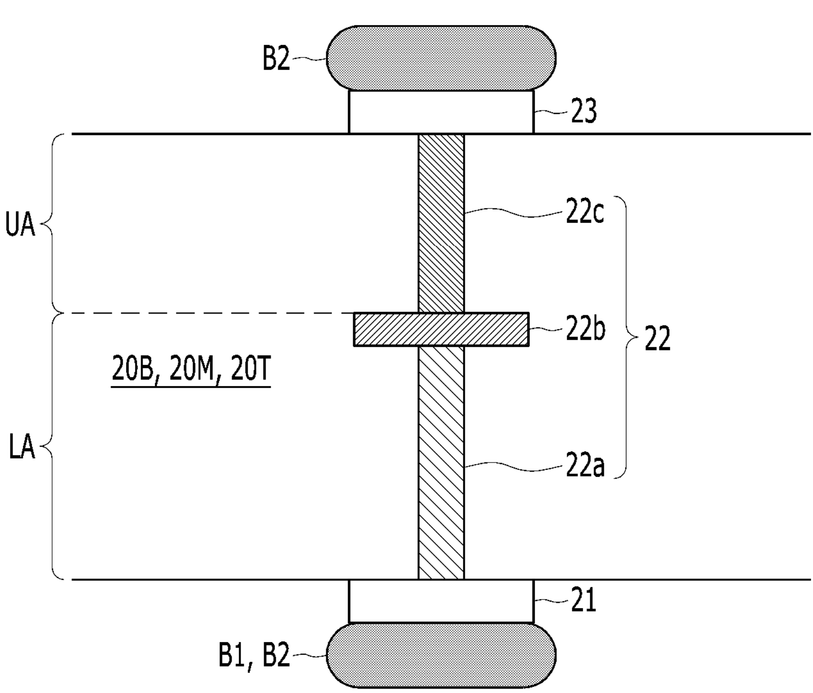
FIG. 9 is an enlarged view schematically illustrating a via structure according to an embodiment of the present disclosure.

FIG. 9 is an enlarged view schematically illustrating a via structure according to an embodiment of the present disclosure. The inventive concepts of a via structure 22 according to an embodiment of the disclosure may be selectively or wholly applied to the via structures 232B, 232M, 232T, 242B, 242M, 242T, 252B, 252M, 252T, 262B, 262M, and 262T of FIGS. 2 to 8. Referring to FIG. 9, the via structure 22 according to an embodiment of the present disclosure may include a metal via **22*a*, a via pad 22*b*, and a TSV (through-silicon via) 22*c*. The metal via 22*a* may extend vertically and partially through the lower area LA of the memory dies 20B, 20M, and 20T to electrically connect a lower bump 21 to the via pad 22*b*. The via pad 22*b* may be disposed between the metal via 22*a* and the TSV 22*c* to electrically connect the metal via 22*a* to the TSV 22*c*. The TSV 22*c* may extend to vertically and partially pass through the upper area UA of the memory dies 20B, 20M, and 20T to electrically connect the via pad 22*b* to an upper bump 23**.

The metal via **22*a* may include a metal such as titanium nitride (TiN), aluminum (Al), or tungsten (W). The via pad 22*b* may include a conductor such as titanium nitride (TiN), aluminum (Al), or tungsten (W). The TSV 22*c* may include a conductor such as copper (Cu). A horizontal width of the via pad 22***b* may be greater than a horizontal width of the metal via 22*a* and a horizontal width of the TSV 22*c*.

The lower areas LA of the memory dies 20B, 20M, and 20T may include metal wirings and insulating layers surrounding the metal wirings. The insulating layers may include silicon oxide-based insulating material layers and silicon nitride-based insulating material layers. Accordingly, the metal via 22*a* may extend to vertically pass through the insulating layer.

The upper areas UA of the memory dies 20B, 20M, and 20T may include a silicon layer. For example, the upper area UA of the memory dies 20B, 20M, and 20T may be a silicon substrate. Accordingly, the TSV 22*c* may extend to vertically pass through the silicon substrate.

Each of the bottom memory die 20B, the intermediate memory dies 20M, and the top memory die 20T may include a via structure 22. Accordingly, the via structure 22 may be applied to all of the bottom via structures 232B, 252B, 262B, the intermediate via structures 232M, 252M, 262M, and the top via structures 232T, 252T, and 262T. That is, the metal via 22*a* may be interpreted as a bottom metal via, an intermediate metal via, and a top metal via; the via pad 22*b* may be interpreted as a bottom via pad, an intermediate via pad, and a top via pad; and the TSV 22*c* may be interpreted as a bottom TSV, an intermediate TSV, and a top TSV.

Figure 10A:
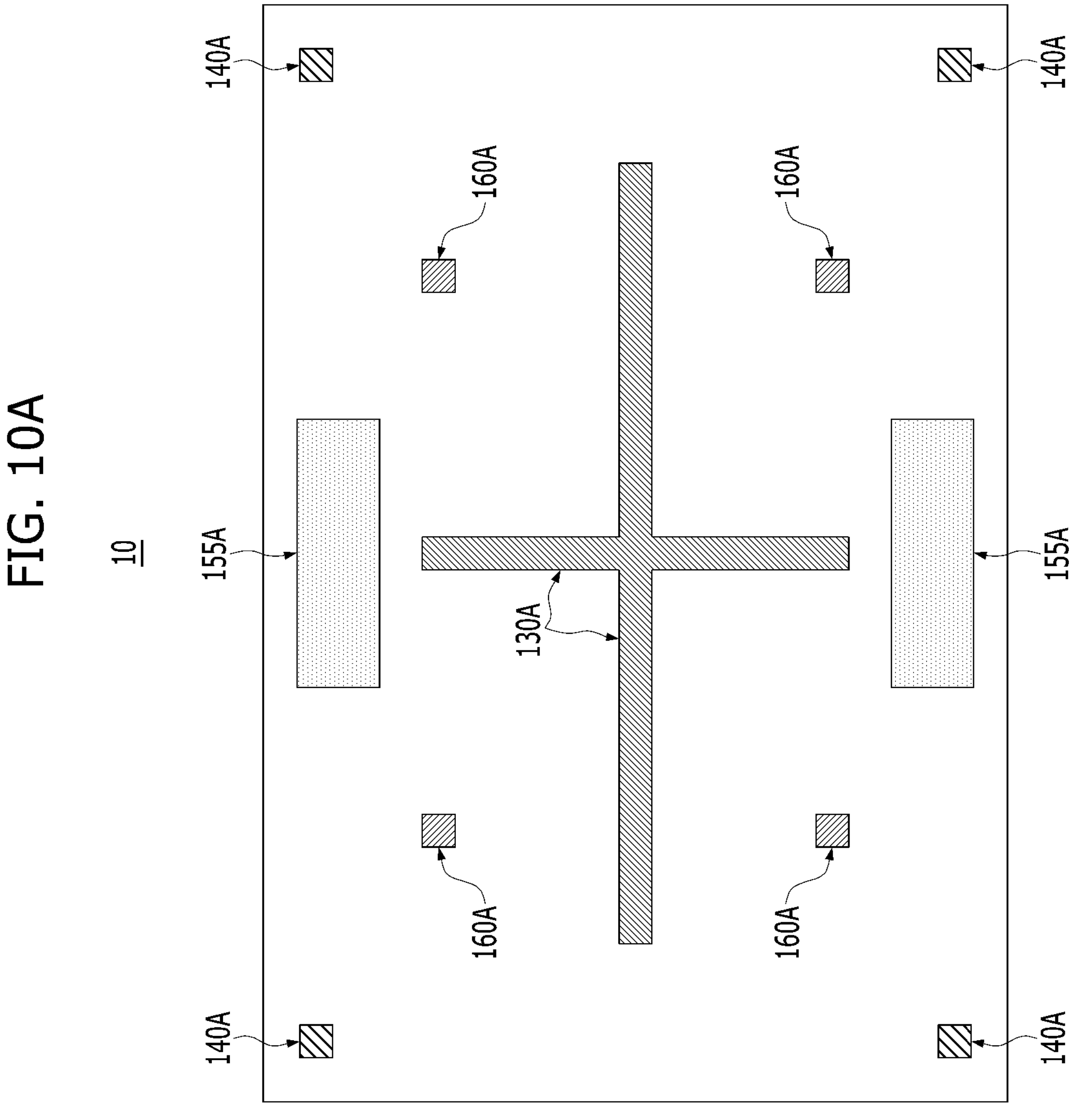
Figure 10B:
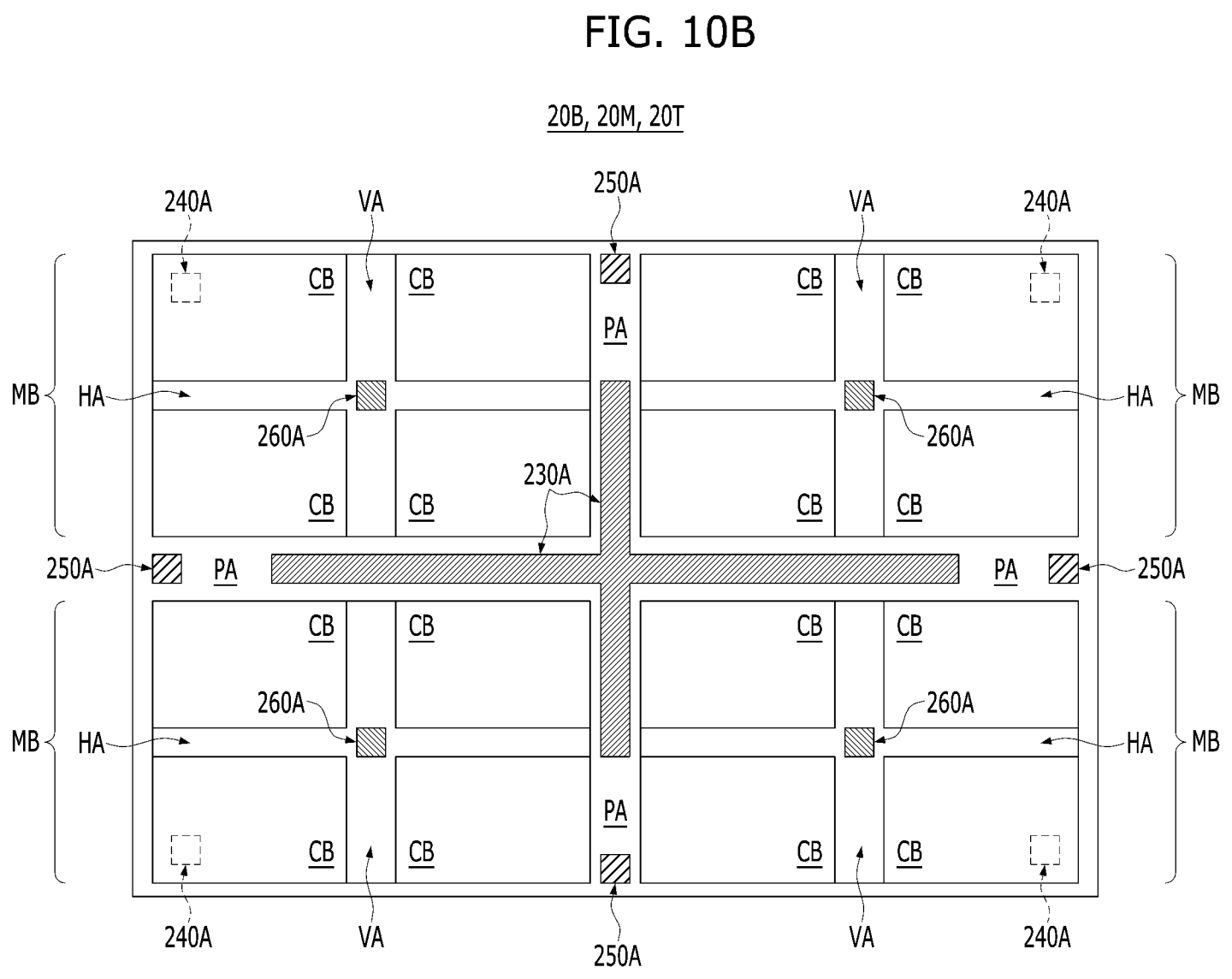

FIGS. 10A and 10B are layouts illustrating block arrangement of a base die and memory dies according to an embodiment of the present disclosure. Referring to FIG. 10A, a base die 10 may include a base signal transmission structure area 130A disposed at a central area, a base first power distribution structure area 140A disposed adjacent to at least one of corners, a base circuit area 155A disposed adjacent to at least one of edges, and a base third power distribution structure area 160A disposed in the intermediate area surrounding the base signal transmission structure area 130A (the central area), namely, between the base signal transmission structure area 130A (the central area) and base first power distribution structure area 140A (the corner area). A base signal transmission structure 130 may be disposed in the base signal transmission structure area 130A. A base first power distribution structure 140 may be disposed in the base first power distribution structure area 140A. A base circuit 155 may be disposed in the base circuit area 155A. A base third power distribution structure 160 may be disposed in the base third power distribution structure area 160A.

Referring to FIG. 10B, each of the memory dies 20B, 20M, and 20T according to an embodiment of the present disclosure may include memory banks MB, peripheral areas PA, memory signal transmission structure areas 230A, memory first power distribution structure areas 240A, memory second power distribution structure areas 250A, and memory third power distribution structure areas 260A.

The memory banks MB may be arranged in a matrix shape. The peripheral areas PA may be disposed between the memory banks MB. Each of the memory banks MB may include memory cell blocks CB disposed in a matrix shape. Vertical core areas VA and horizontal core areas HA may be disposed between the memory cell blocks CB.

The memory signal transmission structure areas 230A may be disposed in the peripheral areas PA. For example, the memory signal transmission structure areas 230A may be disposed in the central areas of the memory dies 20B, 20M, and 20T. Bottom signal transmission structures 230B, intermediate signal transmission structures 230M, and top signal transmission structures 230T may be disposed in the memory signal transmission structure areas 230A. That is, the memory signal transmission structure areas 230A may include a bottom signal transmission structure area, an intermediate memory signal transmission structure area, and a top signal transmission structure area.

The memory first power distribution structure areas 240A may vertically overlap the memory cell blocks CB. Referring to FIG. 3, the bottom lower first power bump 241B, the intermediate lower dummy bumps 241M, and the top lower dummy bump 241T may be disposed in the memory first power distribution structure areas 240A. For example, the memory circuits 245B, 245M, and 245T may be portions of the memory cell banks CB. Any vertical conductive elements (e.g., through vias) passing through the cell banks CB may not be formed in the first power distribution structure areas 240A, and thus, the first power distribution structure areas 240A are indicated by dotted lines.

The second power distribution structure areas 250A may be disposed in the peripheral areas PA, outside the memory banks MB and adjacent to edges of the memory dies 20B, 20M, and 20T. The second power distribution structure areas 250A may be vertically and/or horizontally aligned with the memory signal transmission structure areas 230A.

The third power distribution structure areas 260A may be disposed in the memory banks MB. The third power distribution structure areas 260A may be disposed in areas in which the vertical core areas VA and the horizontal core areas HA intersect, for example, conjunction areas. The third power distribution structure areas 260A may be vertically aligned with the vertical core areas VA in a vertical direction and horizontally aligned with the horizontal core areas HA in a horizontal direction.

Referring again to FIGS. 10A and 10B, the base signal transmission structure area 130A of the base die 10 and the memory signal transmission structure areas 230A of the memory dies 20B, 20M, 20T may be vertically aligned with each other. The base first power distribution structure area 140A of the base die 10 and the first power distribution structure areas 240A in the cell blocks CB of the memory dies 20B, 20M, and 20T may be vertically aligned with each other. The base circuit area 155A of the base die 10 and the second power distribution structure areas 250A of the memory dies 20B, 20M, and 20T may be vertically aligned with each other. The base third power distribution structure area 160A of the base die 10 and the third power distribution structure area 260A of the memory dies 20B, 20M, and 20T may be vertically aligned with each other.

Figure 11A:
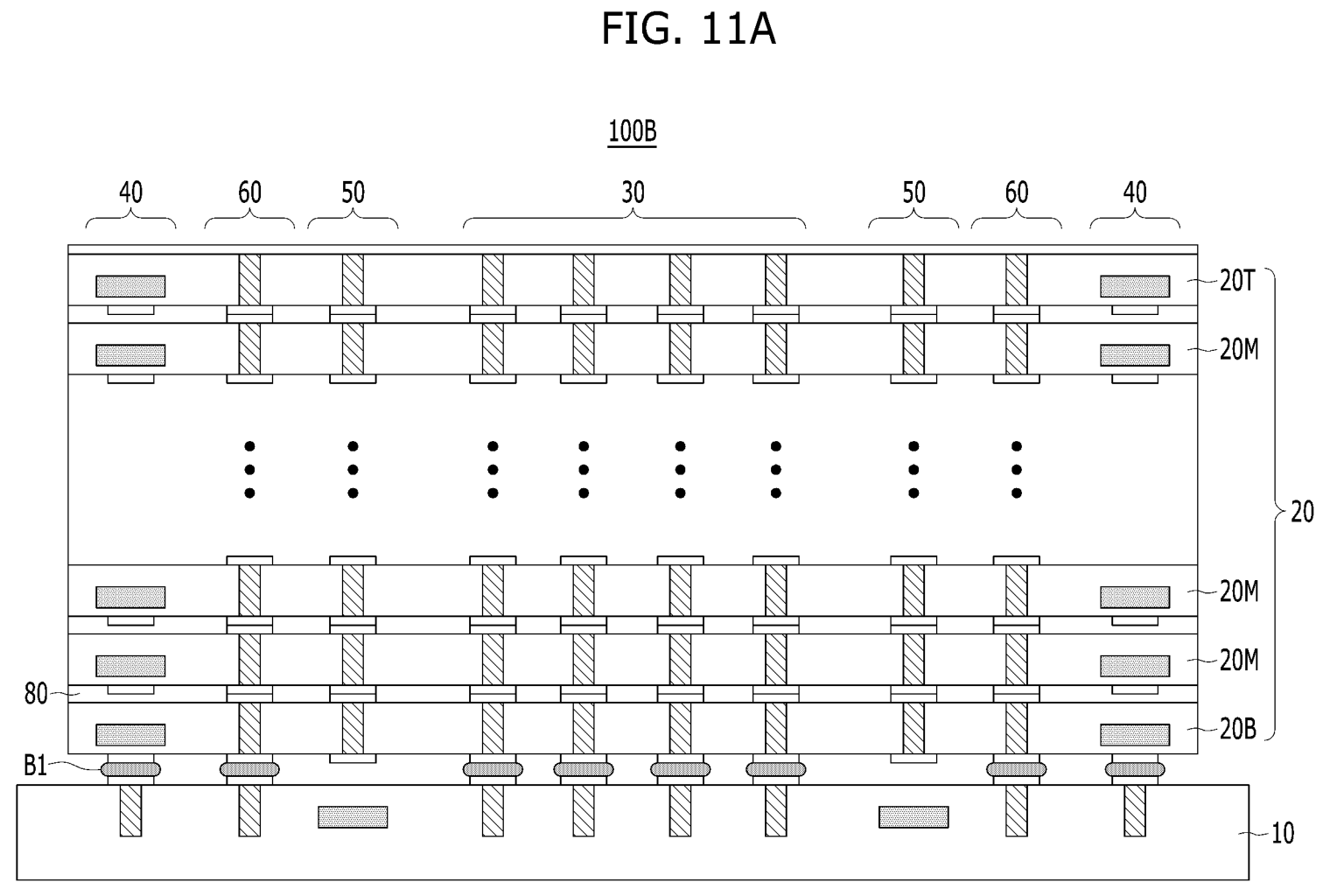
Figure 11B:
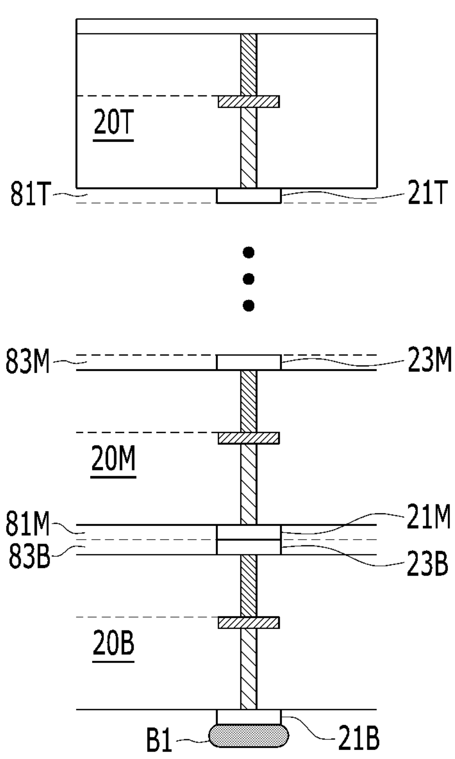
FIG. 11B is an enlarged view of a part of FIG. 11A.

FIG. 11A is a side view schematically illustrating a memory stack structure according to an embodiment of the present disclosure, and FIG. 11B is an enlarged view of a part of FIG. 11A. Referring to FIGS. 11A and 11B, a memory stack structure 100B may include a base die 10, a memory stack 20, signal transmission structures 30, and power distribution structures 40, 50, and 60. Compared with a memory stack structure 100A of FIG. 1, memory dies 20B, 20M, and 20T may be bonded and stacked by a hybrid bonding method and bonding pads 21M, 21T, 23B, and 23M of the memory dies 20B, 20M, and 20T may be directly bonded. For example, bottom upper bonding pad 23B and an intermediate lower bonding pad 21M may be directly bonded, and an intermediate upper bonding pad 23M and a top lower bonding pad 21T may be directly bonded. The bottom memory die 20B may further include a bottom upper bonding insulating layer 83B surrounding side surfaces of the bottom upper bonding pad 23B. The intermediate memory dies 20M may further include intermediate lower bonding insulating layers 81M surrounding side surfaces of the intermediate lower bonding pads 21M, and intermediate upper bonding insulating layers 83M surrounding side surfaces of the intermediate upper bonding pads 23M. The top memory die 20T may further include a top lower bonding insulating layer 81T surrounding side surfaces of the top lower bonding pad 21T. The lower bonding insulating layers 81M and 81T and the upper bonding insulating layers 83B and 83M may be directly in contact with and bonded to each other, respectively. The bonding insulating layers 83B, 81M, 83M, and 81T may include silicon oxide, silicon nitride, or silicon carbon nitride. Other elements that are not illustrated or described may be understood with reference to other drawings.

Figure 12A:
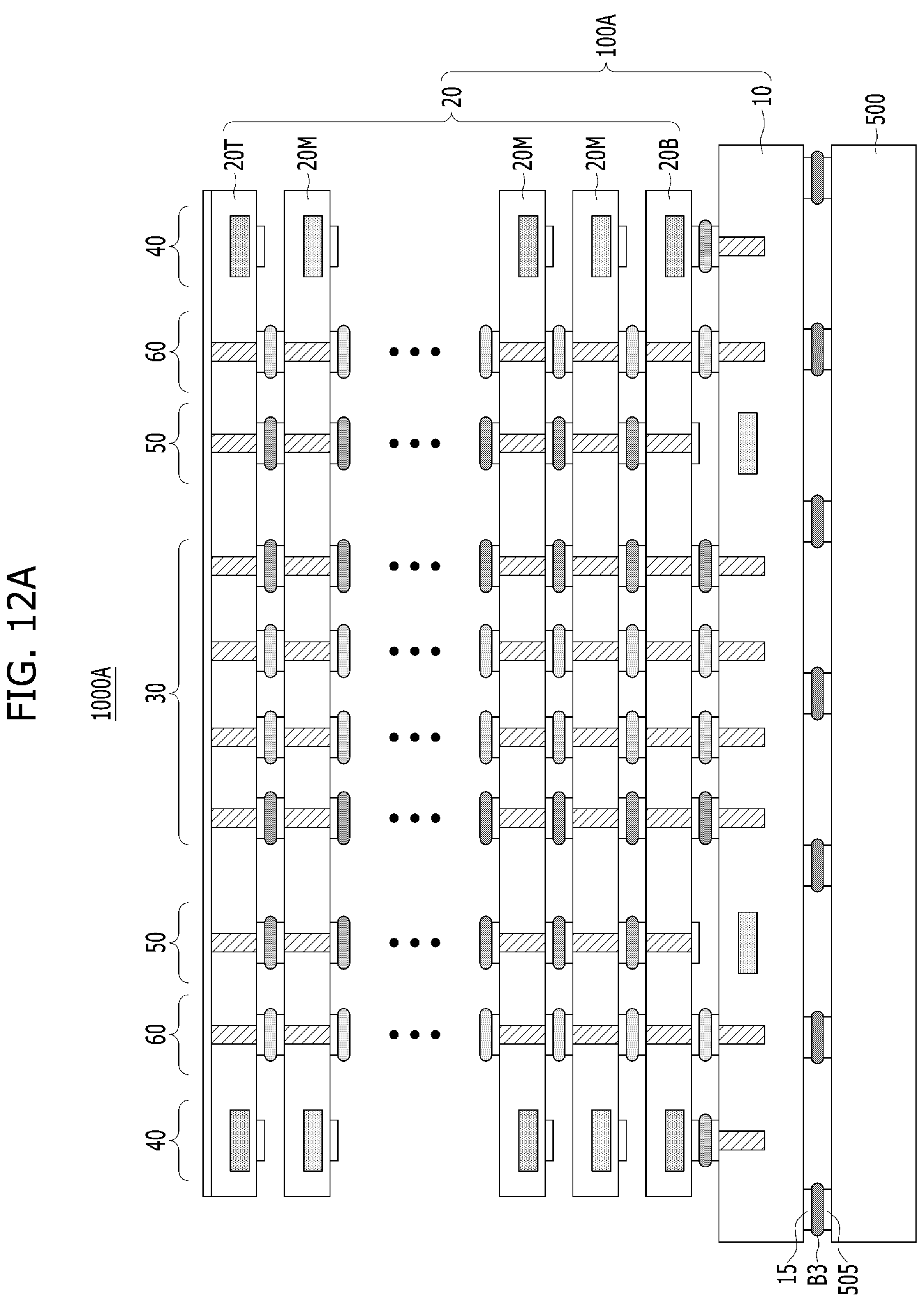
Figure 12B:
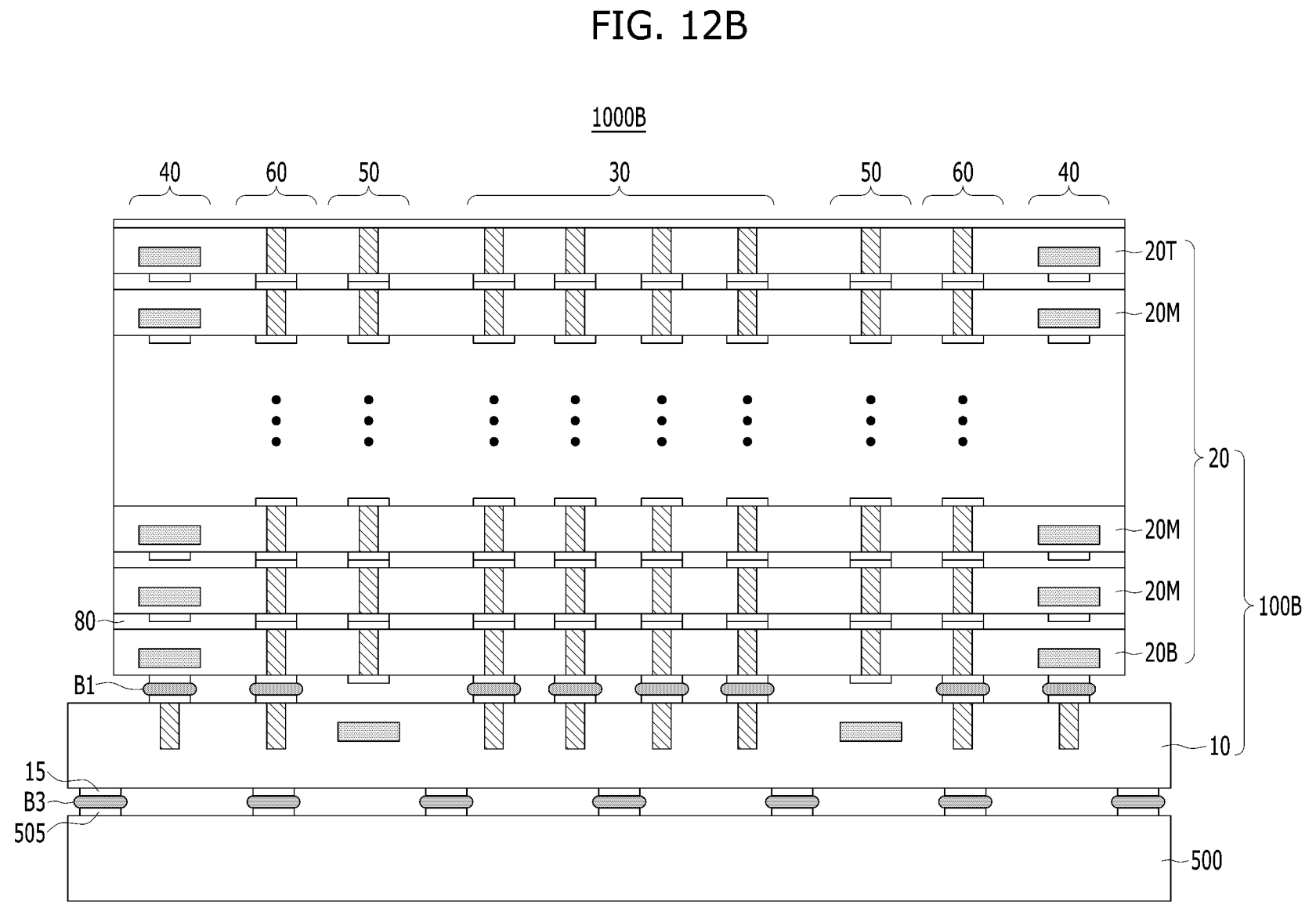

FIGS. 12A and 12B are views schematically illustrating high-bandwidth memories according to embodiments of the present disclosure. Referring to FIGS. 12A and 12B, high-bandwidth memories 1000A and 1000B may include the memory stacks 100A and 100B mounted on an interposer 500. The interposer 500 and the memory stacks 100A and 100B may be electrically connected to each other through the interposer bump 505, the base bump 15, and the interposer connector B3.

According to embodiments of the present disclosure, power from various sources can be stably provided, and operations of a memory stack having multiple memory dies and a high-bandwidth memory can be stabilized.

While the present invention has been described with respect to the specific embodiments, it will be apparent to those skilled in the art that various changes and modifications may be made without departing from the spirit and scope of the invention as defined in the following claims.

What is claimed is:

1. A memory stack structure comprising:

a base die;

a bottom memory die stacked over the base die;

an intermediate memory die stacked over the bottom memory die;

a top memory die stacked over the intermediate memory die;

a signal transmission structure electrically connecting the base die, the bottom memory die, the intermediate memory die, and the top memory die to each other;

a first power distribution structure electrically connecting the base die to the bottom memory die; and a second power distribution structure electrically connecting the bottom memory die, the intermediate memory die, and the top memory die to each other, wherein the first power distribution structure is electrically connected to the second power distribution structure in the bottom memory die.

2. The memory stack structure of claim 1, wherein:

the bottom memory die includes a bottom memory circuit, the intermediate memory die includes an intermediate memory circuit, and the top memory die includes a top memory circuit, wherein the bottom memory circuit, the intermediate memory circuit, and the top memory circuit are disposed areas vertically aligned and overlapped with the first power distribution structure, respectively.

3. The memory stack structure of claim 2, wherein the bottom memory circuit, the intermediate memory circuit, and the top memory circuit includes memory cells, respectively.

4. The memory stack structure of claim 1, wherein the base die further includes a base circuit disposed in an area vertically aligned and overlapped with the second power distribution structure.

5. The memory stack structure of claim 1, further comprising:

a third power distribution structure electrically connecting the base die, the bottom memory die, the intermediate memory die, and the top memory die to each other, wherein the third power distribution structure includes:

a base third power bump over an upper surface of the base die;

a bottom lower third power bump under a lower surface of the bottom memory die;

a bottom third power via structure vertically passing though the bottom memory die;

a bottom upper third power bump over an upper surface of the bottom memory die;

an intermediate lower third power bump under a lower surface of the intermediate memory die;

an intermediate third power via structure vertically passing through the intermediate memory die;

an intermediate upper third power bump over an upper surface of the intermediate memory die; and a top lower third power bump under a lower surface of the top memory die, wherein the base third power bump, the bottom lower third power bump, the bottom third power via structure, the bottom upper third power bump, the intermediate lower third power bump, the intermediate third power via structure, the intermediate upper third power bump, and a top third power bump are vertically aligned and electrically connected to each other.

6. The memory stack structure of claim 5, wherein the first power distribution structure is electrically connected to the third power distribution structure in the bottom memory die.

7. The memory stack structure of claim 5, wherein the second power distribution structure is electrically connected to the third power distribution structure in the bottom memory die.

8. The memory stack structure of claim 1, wherein:

the base die includes a base first power distribution structure area vertically overlapping with the first power distribution structure, the base first power distribution structure area is disposed, in a layout, adjacent to a corner of the base die, the bottom memory die, the intermediate memory die, and the top memory die include memory first power distribution structure areas, respectively, and the memory first power distribution structure areas are disposed, in a layout, adjacent to corners of the bottom memory die, the intermediate memory die, and the top memory die.

9. The memory stack structure of claim 1, wherein:

the base die includes a base circuit disposed, in a layout, adjacent to an edge of the base die, the second power distribution structure is disposed, in a layout, in memory second power distribution structure areas adjacent to edges of the bottom memory die, the intermediate memory die, and the top memory die, respectively, and the base circuit and the memory second power distribution structure areas are vertically aligned to each other.

10. The memory stack structure of claim 1, wherein the base die includes a base third power distribution structure area, wherein each of the bottom memory die, the intermediate memory die, and the top memory die includes a memory third power distribution structure area disposed, in a layout, in a conduction area where vertical and horizontal core areas intersect between cell blocks arranged in a matrix shape, wherein the base third power distribution structure area and the memory third power distribution structure areas are vertically aligned to each other.

11. The memory stack structure of claim 1, further comprising:

an intermediate bump disposed under a lower surface of the intermediate memory die to be vertically aligned with the first power distribution structure, wherein the intermediate bump is electrically connected to the second power distribution structure in the intermediate memory die.

12. The memory stack structure of claim 1, wherein the second power distribution structure includes:

a bottom lower second power bump disposed under a lower surface of the bottom memory die;

a bottom second power via structure vertically penetrating the bottom memory die;

a bottom upper second power bump disposed over an upper surface of the bottom memory die;

an intermediate lower second power bump disposed under a lower surface of the intermediate memory die;

an intermediate second power via structure vertically penetrating the intermediate memory die;

an intermediate upper second power bump disposed over an upper surface of the intermediate memory die; and a second power bump disposed under a lower surface of the top memory die, and wherein the bottom lower second power bump, the bottom second power via structure, the bottom upper second power bump, the intermediate lower second power bump, the intermediate second power via structure, the intermediate upper second power bump, and a top lower second power bump are vertically aligned and electrically connected to each other.

13. The memory stack structure of claim 12, wherein the bottom upper second power bump and the intermediate lower second power bump are directly bonded to each other, and wherein the intermediate upper second power bump and the top lower second power bump are directly bonded to each other.

14. The memory stack structure of claim 13, wherein:

the bottom memory die further includes a bottom upper bonding insulating layer surrounding a side surface of the bottom upper second power bump, the intermediate memory die further includes an intermediate lower bonding insulating layer surrounding a side surface of the intermediate lower second power bump and an intermediate upper bonding insulating layer surrounding a side surface of the intermediate upper second power bump, the top memory die further includes a top lower bonding insulating layer surrounding a side surface of the top lower second power bump, the bottom upper bonding insulating layer and the intermediate lower bonding insulating layer are directly bonded to each other, and the intermediate upper bonding insulating layer and the top lower bonding insulating layer are directly bonded to each other.

15. The memory stack structure of claim 12, wherein the bottom second power via structure includes:

a bottom metal via passing through a lower area of the bottom memory die to be electrically connected to the bottom lower second power bump;

a bottom through-silicon via (TSV) vertically passing through an upper area of the bottom memory die to be electrically connected to the bottom upper second power bump; and a bottom TSV pad between the bottom metal via and the bottom TSV, wherein a horizontal width of the bottom TSV pad is greater than a horizontal width of the bottom metal via and greater than a horizontal width of the bottom TSV, wherein the intermediate second power via structure includes:

an intermediate metal via vertically passing through a lower area of the intermediate memory die to be electrically connected to the intermediate lower second power bump;

an intermediate TSV vertically passing through an upper area of the intermediate memory die to be electrically connected to the intermediate upper second power bump; and an intermediate TSV pad between the intermediate metal via and the intermediate TSV, wherein a horizontal width of the intermediate TSV pad is greater than a horizontal width of the intermediate metal via and greater than a horizontal width of the intermediate TSV.

16. The memory stack structure of claim 12, wherein:

the intermediate memory die includes an intermediate lower dummy bump disposed under the lower surface of the intermediate memory die to be vertically aligned with the first power distribution structure, the intermediate lower dummy bump is electrically connected to the intermediate lower second power bump, the top memory die includes a top lower dummy bump disposed under the lower surface of the top memory die to be vertically aligned with the first power distribution structure, and the top lower dummy bump is electrically connected to the top lower second power bump.

17. A memory stack structure comprising:

a base die;

a bottom memory die stacked over the base die;

an intermediate memory die stacked over the bottom memory die;

a top memory die stacked over the intermediate memory die;

a first power distribution structure electrically connecting the base die to the bottom memory die;

a second power distribution structure electrically connecting the bottom memory die, the intermediate memory die, and the top memory die to each other; and a third power distribution structure electrically connecting the base die, the bottom memory die, the intermediate memory die, and the top memory die to each other, wherein the first power distribution structure is electrically connected to the third power distribution structure in the bottom memory die.

18. The memory stack structure of claim 17, further comprising:

an intermediate bump disposed under a lower surface of the intermediate memory die to be vertically aligned with the first power distribution structure, wherein the intermediate bump is electrically connected to the third power distribution structure in the intermediate memory die.

19. A die stack structure comprising:

a first die;

a second die stacked over the first die;

a third die stacked over the second die;

a fourth die stacked over the third die;

a signal transmission structure electrically connecting the first die, the second die, the third die, and the fourth die to one another in series;

a first power distribution structure electrically connecting the second die, the third die, and the fourth die;

a second power distribution structure electrically connecting the first die, the second die, the third die, and the fourth die, wherein the first power distribution structure is electrically connected to the second power distribution structure in each of the second die, third die, and fourth die.

20. The die stack structure of claim 19, further comprising:

a third power distribution structure electrically connecting the first die to the second die, wherein the first power distribution structure is electrically connected to the third power distribution structure in the first die.

* * * * *